United States Patent [19]

Kitamoto et al.

[11] Patent Number: 5,486,276
[45] Date of Patent: Jan. 23, 1996

[54] METHOD FOR MANUFACTURING SMALL MAGNETIC DISKS FROM A LARGE DISK

[75] Inventors: Yoshito Kitamoto; Masahiro Takagi; Hiroshi Akiba; Kazuyuki Seki, all of Kawasaki, Japan

[73] Assignee: Fujitsu Limited, Kawasaki, Japan

[21] Appl. No.: 120,149

[22] Filed: Sep. 10, 1993

[30] Foreign Application Priority Data

Sep. 10, 1992 [JP] Japan .................................. 4-241790
Sep. 29, 1992 [JP] Japan .................................. 4-259513

[51] Int. Cl.⁶ .............................. C23C 14/34; B05D 3/12
[52] U.S. Cl. ................... 204/192.2; 204/192.16; 204/192.15; 427/129; 427/130; 427/131; 427/289; 427/290
[58] Field of Search ................. 204/192.15, 192.16, 204/192.2, 192.26; 427/129, 130, 131, 599, 289, 290; 428/64

[56] References Cited

U.S. PATENT DOCUMENTS

| 4,990,362 | 2/1991 | Kibe et al. ........................ 204/192.2 |
| 5,030,494 | 7/1991 | Ahlert et al. ...................... 204/192.16 |
| 5,084,319 | 1/1992 | Hibst et al. ....................... 204/192.16 |
| 5,104,709 | 4/1992 | Kokaku et al. .................... 204/192.16 |

FOREIGN PATENT DOCUMENTS

| 56-111130 | 9/1981 | Japan . |
| 61-220119 | 9/1986 | Japan . |
| 64-1118 | 1/1989 | Japan . |
| 170920 | 3/1989 | Japan . |
| 1192019 | 8/1989 | Japan . |
| 1211236 | 8/1989 | Japan . |
| 27249 | 1/1990 | Japan . |
| 2134746 | 5/1990 | Japan . |
| 38118 | 1/1991 | Japan . |
| 3-8118 | 1/1991 | Japan . |
| 3116518 | 5/1991 | Japan . |
| 3144940 | 6/1991 | Japan . |
| 3144941 | 6/1991 | Japan . |
| 3130919 | 6/1991 | Japan . |
| 410214 | 1/1992 | Japan . |
| 438620 | 2/1992 | Japan . |
| 4159633 | 6/1992 | Japan . |

*Primary Examiner*—R. Bruce Breneman
*Assistant Examiner*—Rodney G. McDonald
*Attorney, Agent, or Firm*—Greer, Burns & Crain, Ltd.

[57] ABSTRACT

A method for manufacturing small magnetic disks from a nonmagnetic large disk. A nonmagnetic large disk is first prepared, and subjected to at least one step of a manufacturing process necessary for manufacturing a magnetic disk from a nonmagnetic substrate. The manufacturing process may comprise the steps of applying at least one underlayer to the substrate, applying the layer of magnetic material to the underlayer, applying the protective layer to the layer of magnetic material, applying the lubricating layer to the protective layer, carrying out a texture treatment, polishing the underlayer, and burnishing the protective layer, and carrying out a levitation and characteristic test. After at least one of these steps, the large disk is divided into a plurality of the small disks. Accordingly, it is possible to manufacture small magnetic disks, by the use of manufacturing equipment designed to manufacture large magnetic disks.

15 Claims, 8 Drawing Sheets

METHOD FOR MANUFACTURING SMALL MAGNETIC DISKS FROM A LARGE DISK

BACKGROUND OF THE INVENTION

1. Field of the Invention

The present invention relates to a method for manufacturing small magnetic disks comprising a nonmagnetic substrate and a layer of magnetic material applied to the nonmagnetic substrate.

2. Description of the Related Art

In a magnetic disk apparatus used as a file system in an information processing system, various sizes of magnetic disks are used. The size of the magnetic disks used is being increasingly reduced, and recently, small magnetic disks having the size of, for example, 1.8 inch, 1.6 inch, or 1.3 inch have been realized.

The magnetic disks are manufactured, using manufacturing equipment including treating stations. The magnetic disks are carried, handled and transported by disk carriers and robots within the treating stations and between the treating stations. Some of the disk carriers and robots are designed to handle and transport magnetic disks having a particular size. Therefore, in order to manufacture small magnetic disks having the size of, for example, 2.5 to 1.0 inch, it is impossible to use manufacturing equipment designed to manufacture large magnetic disks having the size of, for example, 3.5 to 10 inches, and it is necessary to prepare new manufacturing equipment particularly adapted to manufacturing small magnetic disks. The manufacturing process for the magnetic disks includes many steps, and accordingly, much manufacturing equipment must be prepared for exclusive use of small magnetic disks, while separate manufacturing equipment must still be maintained for manufacturing large magnetic disks. Therefore, a problem arises in that the cost for manufacturing the small magnetic disks becomes high due to the need for special equipment and the time consumed for preparing the new equipment. A further problem is that in some cases, it is difficult to treat and handle small disks.

SUMMARY OF THE INVENTION

The object of the present invention is to solve the above described problem and to provide a method for manufacturing small magnetic disks which enables the use of existing manufacturing equipment adapted for manufacturing large magnetic disks.

Another object of the present invention is to provide a small magnetic disk for which a conventional texturing treatment can be omitted.

According to the present invention, there is provided a method for manufacturing small magnetic disks having an outer diameter, the method comprising the steps of: preparing a large nonmagnetic disk having an outer diameter and an inner diameter, one half of the difference between the outer and inner diameters of the large disk being greater than the outer diameter of small disks to be manufactured; subjecting said large disk to at least one step of a manufacturing process necessary for manufacturing a magnetic disk from a nonmagnetic substrate; and dividing the large disk into a plurality of small disks.

In this method, it is possible to obtain small magnetic disks by the use of, at least partly, conventional manufacturing equipment designed to manufacture large magnetic disks, and accordingly, it is possible to reduce cost and time required for manufacturing small magnetic disks.

Preferably, each of the small disks may comprise a nonmagnetic substrate, at least one underlayer applied to the substrate, a layer of magnetic material applied to the underlayer, a protective layer applied to the layer of magnetic material, and a lubricating layer applied to the protective layer. In this case, the manufacturing process comprises the steps of applying the at least one underlayer to the substrate, applying the layer of magnetic material to the underlayer, applying the protective layer to the layer of magnetic material, and applying the lubricating layer on the protective layer.

The large disk is divided into a plurality of small disks after these manufacturing steps are completed; or alternatively, the large disk is divided into a plurality of small disks after at least one of the manufacturing steps is completed and the remaining manufacturing steps are completed after the large disk is divided.

Preferably, the manufacturing process further comprises the steps of subjecting the at least one underlayer to a texture treatment, polishing the at least one underlayer, and burnishing the protective layer.

When the texture treatment is to be carried out, the large disk is divided into a plurality of small disks after the at least one underlayer is subjected to the texture treatment and the layer of magnetic material is applied to the underlayer; or alternatively, the large disk is divided into a plurality of small disks before the at least one underlayer is subjected to the texture treatment and the layer of magnetic material is applied to the underlayer.

In another aspect of the present invention, there is provided a magnetic disk comprising a substrate, at least one underlayer applied to the substrate, a layer of magnetic material applied to the underlayer, and a protective layer applied to the layer of magnetic material, the protective layer being formed by a sputtering treatment and comprising at least two kinds of sputtered particles having differently controlled grain sizes and mixed to each other.

In this case, preferably, one kind of sputtered particles having a larger grain size are obliquely deposited on the layer of the magnetic material.

Preferably, the protective layer is manufactured by a sputtering treatment simultaneously using at least two targets different from each other in material or applicable power.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

FIGS. 1A to 1D show the method for manufacturing small magnetic disks 11 from a large nonmagnetic large disk 10, according to the present invention.

Figure 1A:
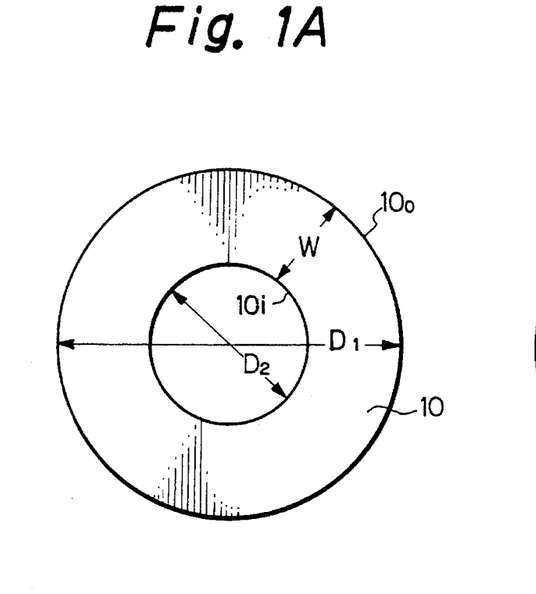
FIGS. 1A to 1D are views of the large disk and the small disks in sequential manufacturing steps according to the embodiment of the present invention.

In FIG. 1A, a nonmagnetic large disk 10 is prepared. The large disk 10 has an outer periphery 10o, an inner periphery 10i, an outer diameter $D_1$, and an inner diameter $D_2$. One half of the difference between the outer and inner diameters $D_1$ and $D_2$ of the large disk 10 is represented by the character W. The large disk 10 is designed so that one half of the difference W between the outer and inner diameters $D_1$ and $D_2$ is greater than the outer diameter D of the small disks 11 to be manufactured.

Figure 1B:
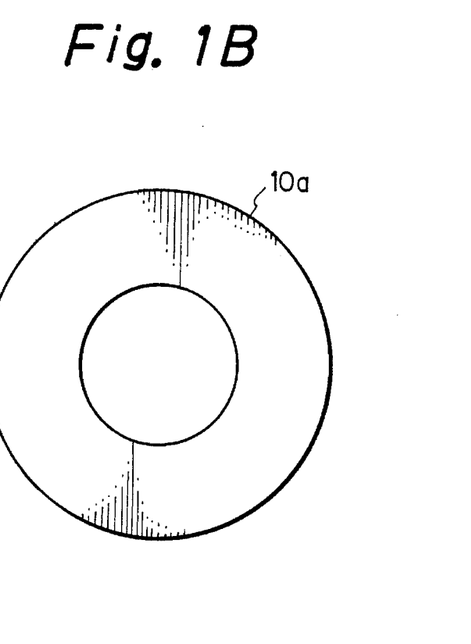

In FIG. 1B, the large disk 10 is subjected to at least one step of a manufacturing process necessary for manufacturing a magnetic disk from a nonmagnetic substrate. The large disk subjected to at least one step of a manufacturing process is represented the character 10a. The details of the manufacturing process will be described later with reference to FIGS. 2 to 5.

Figure 1C:
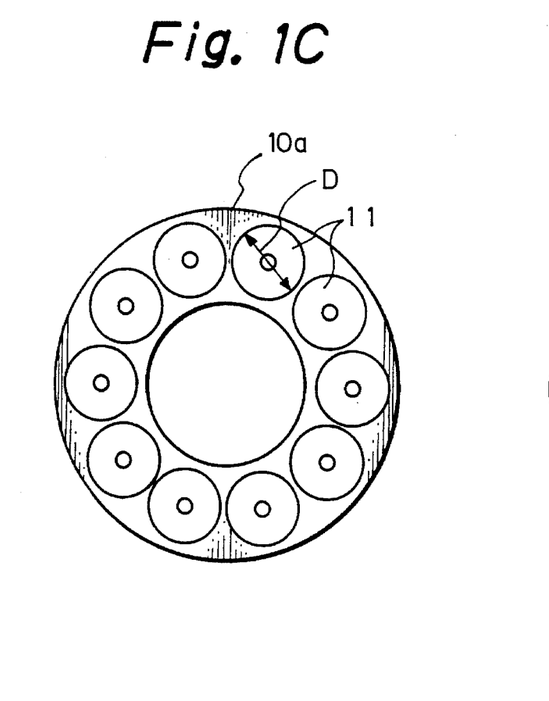
Figure 1D:
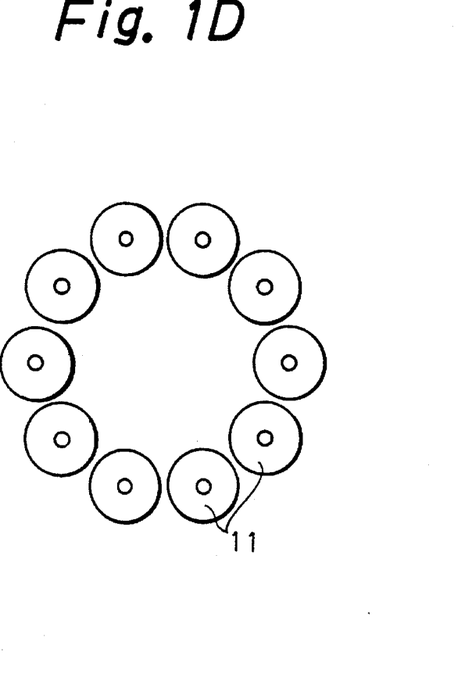

In FIG. 1C, the large disk 10a is divided into a plurality of small disks 11 having an outer diameter D. Each of the divided small disks 11 are separated from the large disk 10a, as shown in FIG. 1D.

Figure 2:
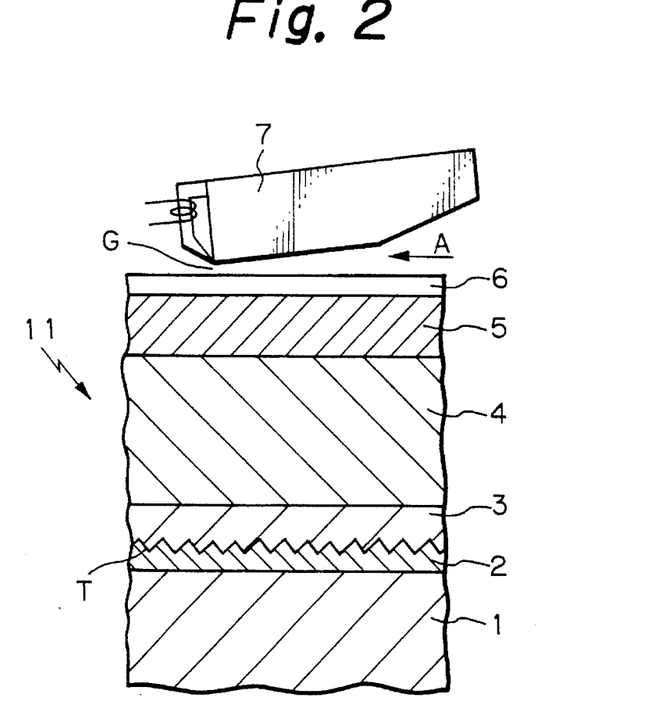
FIG. 2 is a cross-sectional view of one example of the magnetic disk with a magnetic head cooperating with the magnetic disk.

FIG. 2 shows one example of the structure of the small magnetic disk 11. The small magnetic disk 11 comprises a nonmagnetic substrate 1 of aluminum, a first underlayer 2 of NiP plating, a second underlayer 3 of chromium, a layer of magnetic material 4 of Co alloy (such as CoCrTa, CoCrPt, or CoNiCr), a protective layer 5 of carbon, and a lubricating layer 6 of fluoric resin. It will be noted that the large disk 10 of FIG. 1A corresponds to the substrate 1. It is, of course, possible to make these layers from the other materials.

Accordingly, the manufacturing process includes the steps of applying the underlayers 2 and 3 to the substrate 1, applying the layer of magnetic material 4 to the underlayer 3, applying the protective layer 5 to the layer of magnetic material 4, and applying the lubricating layer 6 to the protective layer 5. Typically, the second underlayer 3, the layer of magnetic material 4, and the protective layer 5 are applied by a sputtering technique.

In FIG. 2, a texturing treatment T is carried out on the surface of the first underlayer 2 by applying a grinding tape to the first underlayer 2 of the rotating disk after the first underlayer 2 is polished. The texturing treatment T is carried out for imparting a magnetic anisotropy to the layer of magnetic material 4 to improve an electromagnetic conversion characteristic. The second underlayer 3 functions to improve a horizontal alignment of the layer of magnetic material 4.

Figure 3:
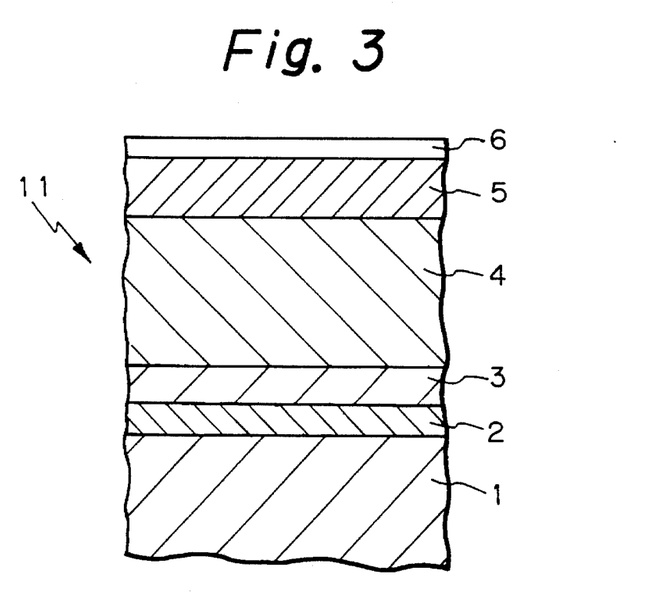
FIG. 3 is a cross-sectional view of another example of the magnetic disk.

However, it is possible to omit the texturing treatment T, as shown in FIG. 3, which shows the similar structure to that of FIG. 2 except for the texturing treatment T. When the texturing treatment T is omitted, it is preferable to control the condition of the surface of the first underlayer 2 by controlling the polishing procedure of the first underlayer 2. It is also preferable to control a magnetic anisotropy of the layer of the magnetic material 4, by improving the sputtering treatment applied to the protective layer 5, which will be described below with reference to FIG. 8.

Figure 4:
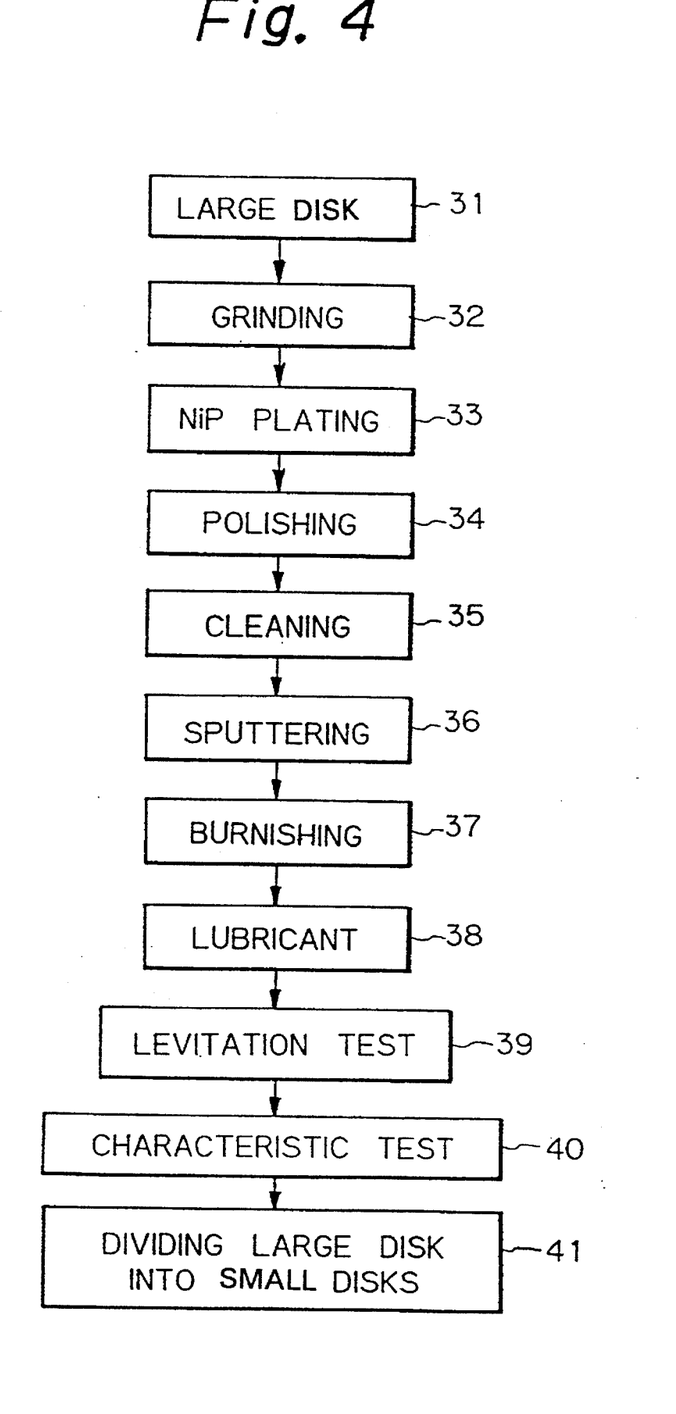
FIG. 4 is a flowchart of the manufacturing process for manufacturing the small magnetic disk.

FIG. 4 is a flowchart of the manufacturing process for manufacturing the small magnetic disk 11. At step 31, a large disk 10 is prepared, as described with reference to FIG. 1A. At steps 32 to 40, the large disk 10 is subjected to the manufacturing process, as described with reference to FIG. 1B. The large disk 10 is treated by grinding at step 32, and then the first underlayer 2 is plated onto the large disk 10 at step 33. The first underlayer 2 is then polished at step 34 and the texturing treatment T is carried out if the texturing treatment is necessary. The first underlayer 2 is then cleaned at step 35.

The large disk 10 is then subjected, at step 36, to a sequential sputtering operation to form the second underlayer 3, the layer of magnetic material 4, and the protective layer 5 one layer above another layer. The large disk 10 is then subjected to a burnishing treatment at step 37, and then the lubricating layer 6 is applied to the large disk 10 at step 38, by sinking the large disk 10 in the solution of the lubricant or spin coating the lubricant onto the large disk 10. The large disk 10 is then heated to evaporate the solvent in the lubricant.

As shown in FIG. 2, a magnetic head 7 is used to cooperate with the magnetic disk 11 during the operation of the magnetic disk apparatus. The magnetic disk 11 rotates in the direction of the arrow A, and the magnetic head 7 levitates above the magnetic head 7 at a gap G between the magnetic head 7 and the magnetic disk 11 due to the air flow by the rotating magnetic disk 11. The magnetic disk apparatus is designed so that it functions when the magnetic head 7 levitates above the magnetic head 7 at a predetermined gap G. Accordingly, a levitation test is carried out in the manufacturing process. The levitation test is carried out with respect to the large disk 10 (or 10a) at step 39 of FIG. 4. The large disk 10 is then subjected to a characteristic test at step 40, by actually storing data on and reading data from the large disk 10.

The large disk 10 is then divided into a plurality of the small disks 11 at step 41. To divide the large disk 10 into a plurality of the small disks 11, it is possible to use a variety of separation techniques, for example, using a laser beam, a discharge cutting, a jet of high pressure fluid, a press, a lathe, or etching.

The large disk 10 at step 40 may be in the form of a complete magnetic disk and it is thus possible to use conventional manufacturing equipment designed to manufacture large magnetic disks. It is only necessary to prepare new equipment to divide the large disk 10 into a plurality of the small disks 11. Therefore, it is possible to reduce the cost and time required for manufacturing small magnetic disks 11, according to the present invention.

Figure 5:
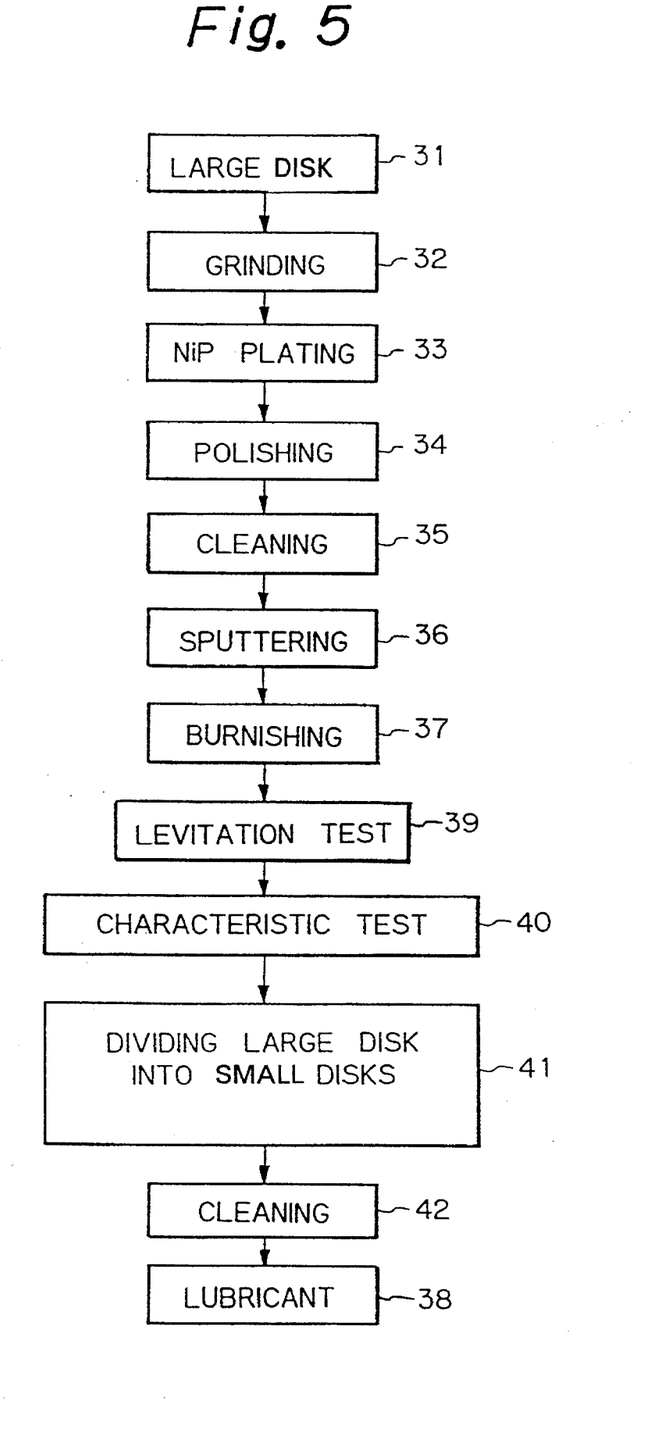
FIG. 5 is a flowchart of another example of the manufacturing process for manufacturing the small magnetic disk.

FIG. 5 shows another example of the manufacturing process for manufacturing the small magnetic disk 11. FIG. 5 includes similar steps to those of FIG. 4, and the identical steps are represented by the identical reference numerals to those of FIG. 4. The manufacturing process of FIG. 5 comprises preparing a large disk 10 at step 31, grinding the large disk 10 at step 32, plating the first underlayer 2 at step 33, polishing and texturing the underlayer 2 at step 34, cleaning the first underlayer 2 at step 35, sputtering the large disk 10 at step 36 to form the second underlayer 3, the layer of magnetic material 4, and the protective layer 5, burnishing the large disk 10 at step 37, carrying out the levitation test at step 39, and then carrying out the characteristic test at step 40.

Then, the large disk 10 is divided into a plurality of the small disks 11 at step 41. The obtained small disks 11 are cleaned at step 42. Finally, the lubricating layer 6 is applied to the small disks 11 at step 38.

Figure 6:
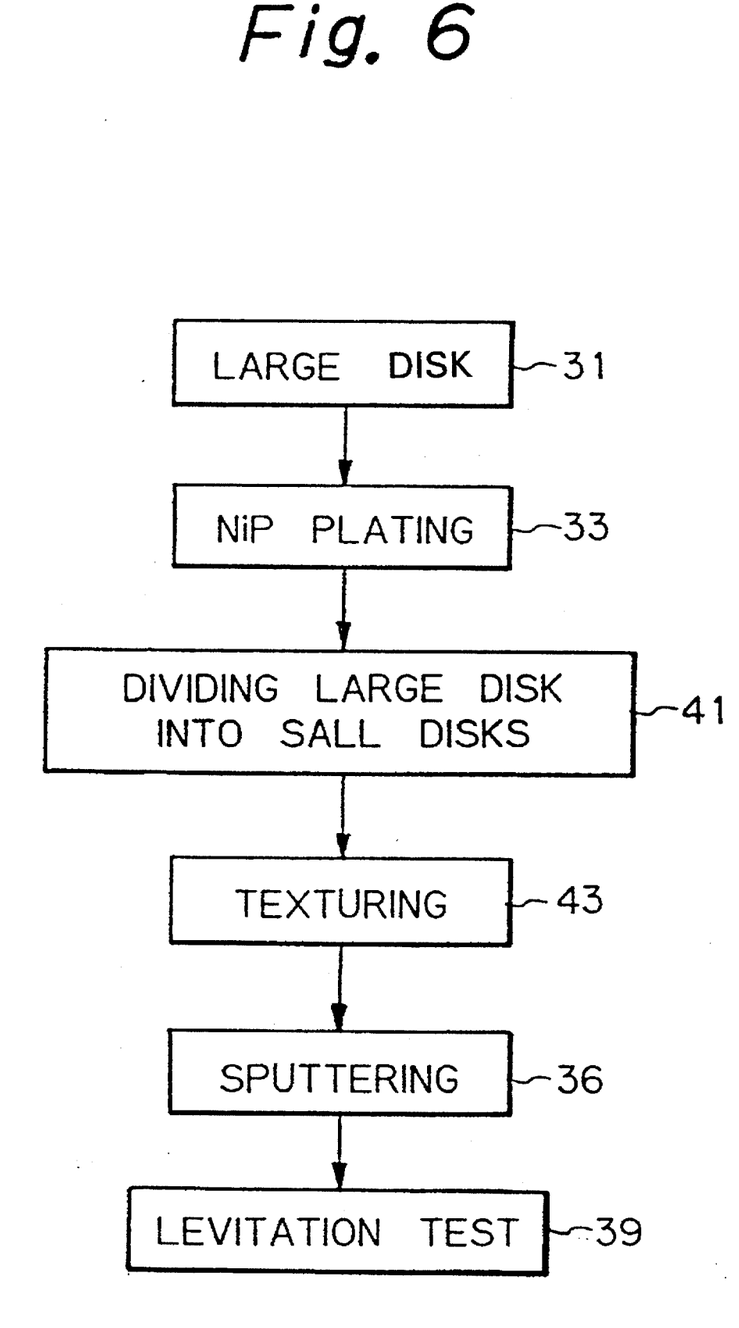
FIG. 6 is a flowchart of still another example of the manufacturing process for manufacturing the small magnetic disk.

FIG. 6 shows still another example of the manufacturing process for manufacturing the small magnetic disk 11. FIG. 6 is shown in a simplified manner but includes similar steps to those of FIG. 4. The manufacturing process of FIG. 6 comprises preparing a large disk 10 at step 31, plating the first underlayer 2 at step 33, and then the large disk 10 is divided into a plurality of the small disks 11 at step 41. The underlayer 2 of the obtained small disks 11 are subjected to the texturing operation T at step 43. The small disks 11 are then subjected to a sequential sputtering operation to form the second underlayer 3, the layer of magnetic material 4, and the protective layer 5 at step 37. And finally, levitation and characteristic tests are carried out.

As shown in FIGS. 5 and 6, it is possible to subject the large disk 10 to at least one step of a manufacturing process necessary for manufacturing a magnetic disk 11 from a nonmagnetic substrate 1, and then to divide the large disk 10 into a plurality of the small disks 11. Accordingly, it is possible to obtain small magnetic disks 11 by the use of, at least partly, conventional manufacturing equipment designed to manufacture large magnetic disks, and accordingly, it is possible to reduce the cost and time required for manufacturing small magnetic disks.

Figure 7:
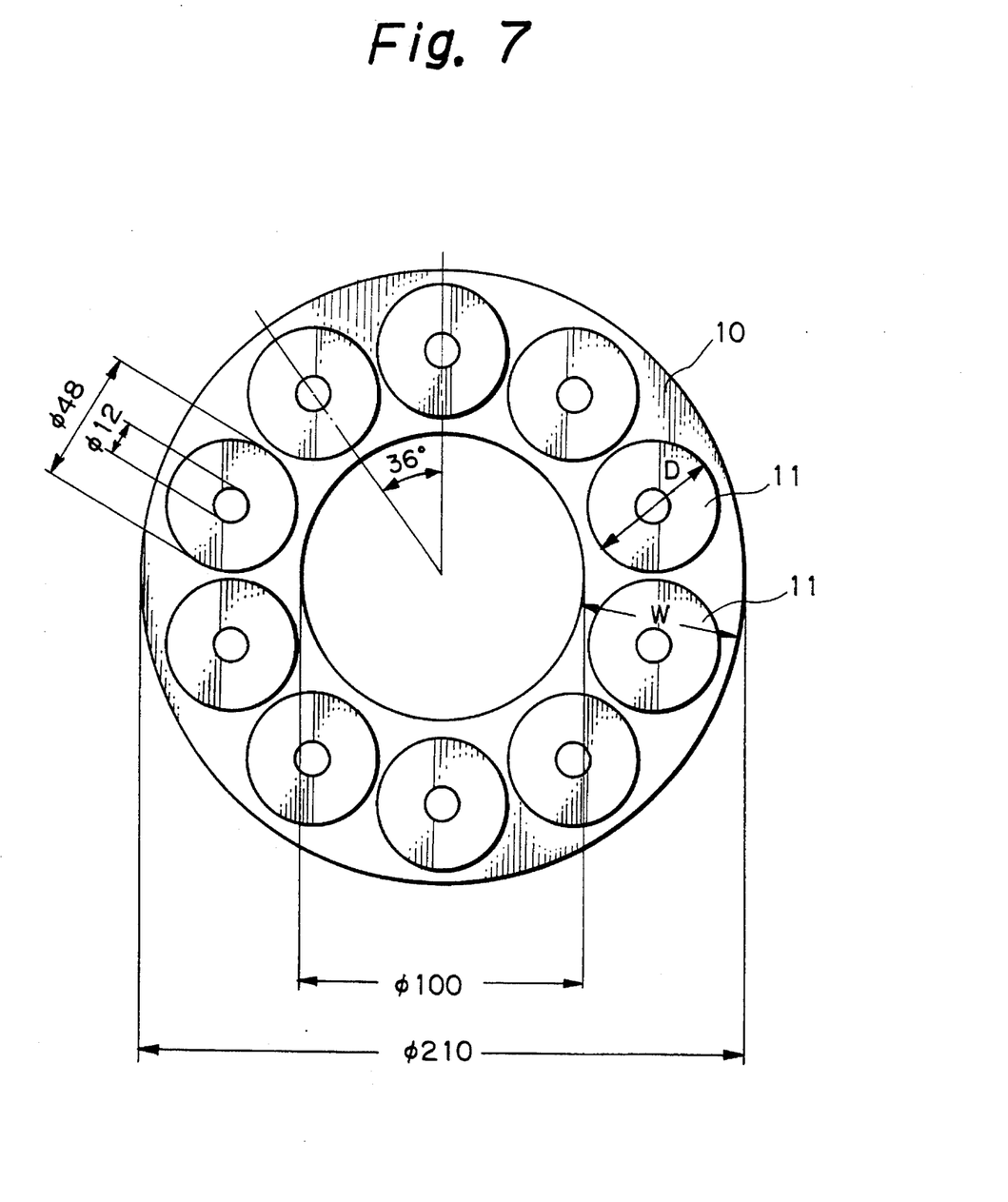
FIG. 7 is a view illustrating the layout of the small disks on the large disk.

FIG. 7 shows the layout of the small disks 11 on the large disk 10. The large disk 10 is a disk having a size of 8.25 inch, an outer diameter of 210 mm and an inner diameter of 100 mm. Thus the difference W between the outer and inner diameters $D_1$ and $D_2$ of the large disk 10 is 55 mm. Accordingly, it is possible to divide the large disk 10 into the small disks 11 having the outer diameter D that is smaller than 55 mm.

In selecting a small disk 11 having the outer diameter D smaller than 55 mm among magnetic disks having standard sizes, a disk having the size of 1.89 inch and an outer diameter of 48 mm exists. With respect to a disk having the size of 1.89 inch, it is possible to layout ten small disks 11 at an angular pitch of 36 degrees on the large disk 10, and thus it is possible to obtain ten small magnetic disks 11 from one large disk 10.

The following table is an example of the relationship of the large disk 10 having standard sizes and small disks 11 having standard sizes and obtained from the large disk 10. In the table, SIZE is a nominal size represented in the units of inches; and one half of the difference W of outer and inner diameters of the large disk 10, the outer diameter D, and the thickness T of the disks are represented in the units of millimeters. NUMBER is the number of the small disks 11 obtained from one large disk 10.

| LARGE DISK | | | SMALL DISK | | | NUMBER |
|---|---|---|---|---|---|---|
| SIZE (in.) | W (mm) | T (mm) | SIZE (in.) | D (mm) | T (mm) | of small disks |
| 10.5 | 84 | 1.095 | 2.5 | 65 | 0.889 | 10 |
| 8.25 | 55 | 1.095 | 1.89 | 48 | 0.635 | 10 |
| 5.25 | 45 | 1.27 | 1.6 | 40 | 0.508 | 6 |
| 5.25 | 45 | 1.27 | 1.3 | 33 | 0.508 (0.457, 0.457) | 8 |
| 3.5 | 35 | 1.27 (0.8) | 1.0 | 25 | 0.381 | 8 |

In this way, it is possible to layout the small disks 11 on a large disk 10 having a standard size. It is preferable to use a large disk 10 having a standard size so that conventional equipment can be used. However, it may be necessary to prepare a large disk 10 having a standard size but with the thickness thereof corresponding to the thickness of the small disks 11 to be manufactured.

It will be noted that the above described embodiments are shown by way of an example and various modification can be made within the spirit of the present invention. For example, it is possible to make the large disk 10 from material other than aluminum, such as glass. It is also possible to form the layer of the magnetic material 4 by a plating method, or by a coating of magnetic powder material. In the latter case, it is preferable to divide the large disk 10 into the small disks 11 before the layer of the magnetic powder material 4 is applied to the disk. The present invention can be also applicable to the manufacture of flexible disks.

As described previously with reference to FIGS. 2 and 3, the magnetic disk 11 comprises a nonmagnetic substrate 1, a first underlayer 2, a second underlayer 3, a layer of magnetic material 4, a protective layer 5, and a lubricating layer 6. The second underlayer 3, the layer of magnetic material 4, and the protective layer 5 can be formed by a sequential sputtering treatment.

Figure 8:
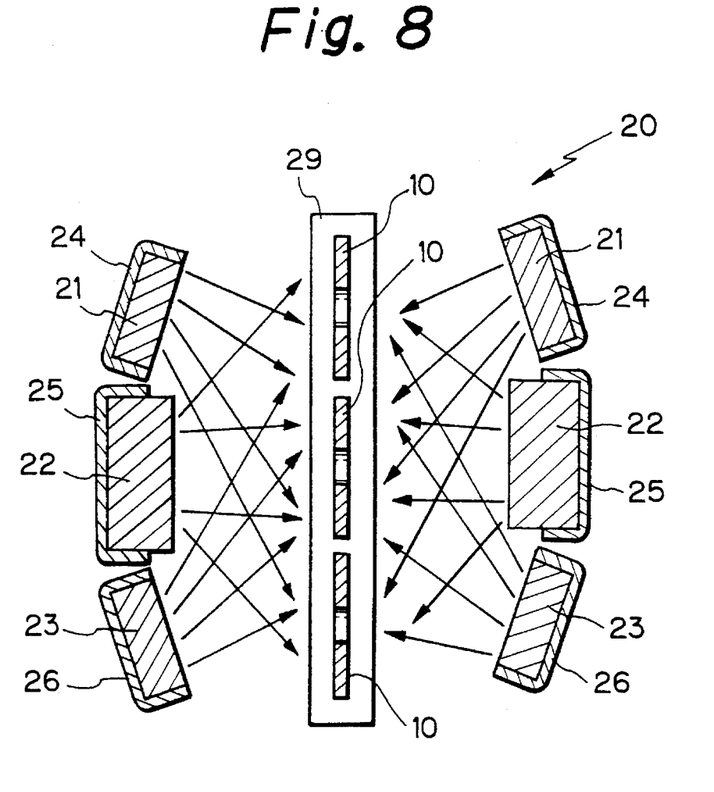
FIG. 8 is a horizontal cross-sectional view of the sputtering apparatus for forming the protective cover on the layer of the magnetic material of the disk.

FIG. 8 is a horizontal cross-sectional view of the sputtering apparatus 20 for forming the protective cover 5 on the magnetic material 4 of the disk. In this case, the second underlayer 3 and the layer of magnetic material 4 are already formed on the large disk 10.

The texturing treatment T of FIG. 2 is not carried out on the surface of the first underlayer 2, because it is difficult to carry out a texturing treatment T by applying a grinding tape to the first underlayer 2 of the rotating disk 10 since the small disk 11 is very thin, as can be seen from the above table. Accordingly, the surface of the protective layer 5 and/or the lubricating layer 6 may become smooth, as shown in FIG. 3.

However, there is a need to roughen the surface of the protective layer 5 and/or the lubricating layer 6. For example, it is necessary for the magnetic head 7 to be acclimated with the magnetic disk 11 prior to the shipment of the magnetic disk apparatus. For this purpose, the magnetic head 7 is urged to the magnetic disk 11 which is rotated very fast, so that abrasion occurs in a portion of the magnetic head 7 and so that the magnetic head 7 can closely cooperate with the magnetic disk 11. Therefore, it is preferable that the surface of the protective layer 5 and/or the lubricating layer 6 be roughened.

Figure 10A:
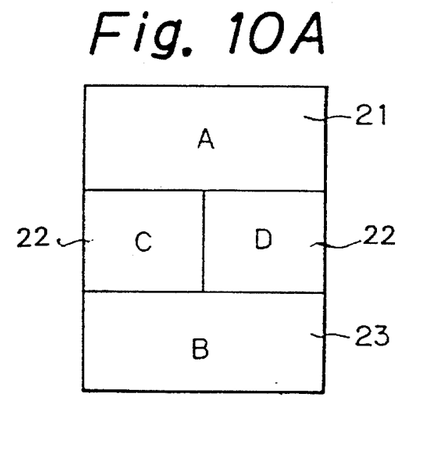
FIGS. 10A to 10F are views of various examples of the arrangement of the targets of FIG. 7.
Figure 10B:
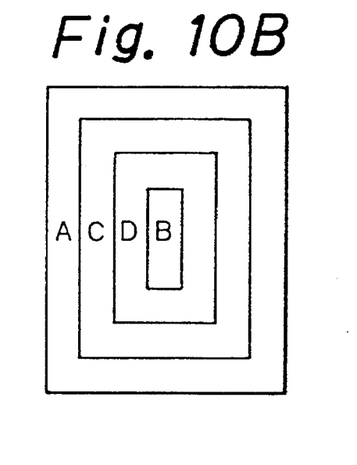
Figure 10C:
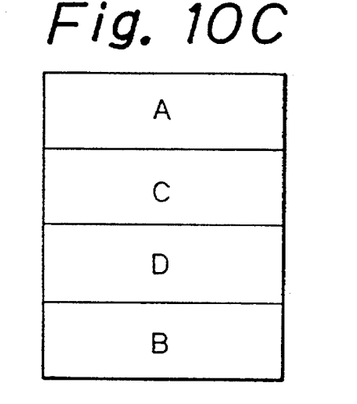
Figure 10D:
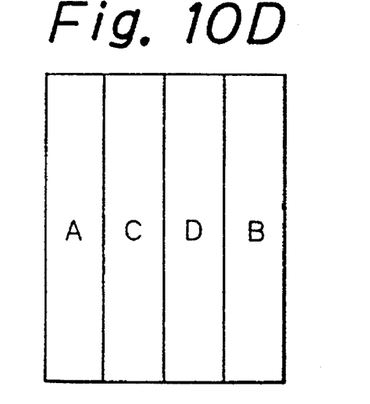
Figure 10E:
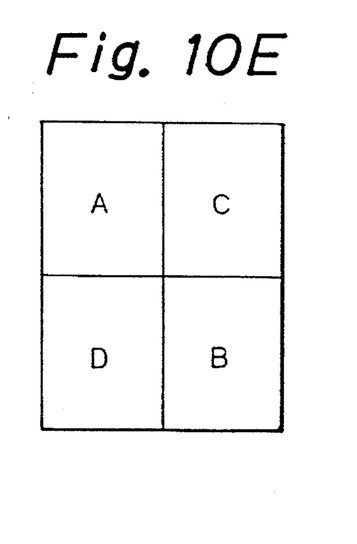
Figure 10F:
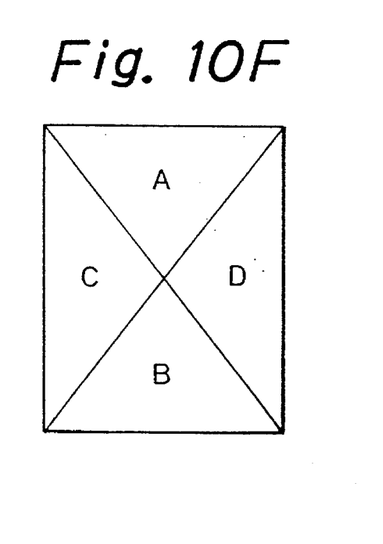

FIG. 8 shows the sputtering apparatus 20 comprising a plurality of simultaneously used targets 21, 22, and 23, and a plurality of large disks 10 carried by a carrier 29 which travels along the targets 21, 22 and 23. It is, of course, possible to use another type of sputtering apparatus 20, such as a batch type sputtering apparatus. The targets 21, 22, and 23 are attached to electrodes 24, 25 and 26, respectively, which enclose the targets 21, 22, and 23 except for the front faces of the targets 21, 22 and 23, respectively. The targets 21, 22 and 23 are arranged in a pattern, as shown in FIG. 10A in which two targets 22 are located at the central region C and D, and two targets 21 and 23 are located at the outside regions A and B.

The targets 21, 22, and 23 can be arranged in various patterns, as shown in FIGS. 10B to 10F. The targets 21, 22, and 23 are arranged in a concentric pattern in FIG. 10B, in a pattern of a row in FIG. 10C, in a pattern of a column in FIG. 10D, in a chessboard pattern in FIG. 10E, and in a radial pattern in FIG. 10F.

Figure 9:
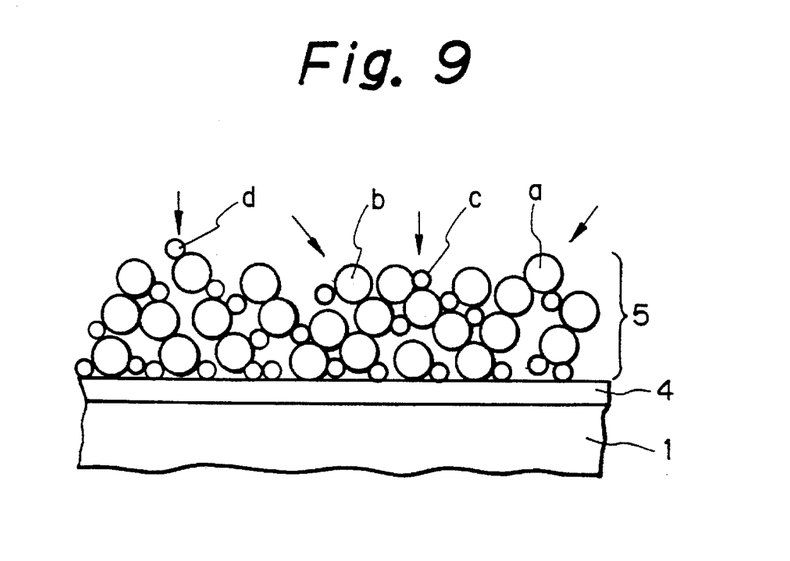
FIG. 9 is a diagrammatic view illustrating the formation of the sputtering particles.

The sputtering apparatus 20 is designed so that the targets 21, 22, and 23 form the protective layer 5 10 comprising at least two kinds of sputtered particles "a" and "b", and "c" and "d" having differently controlled grain sizes and mixed with each other, as shown in FIG. 9. Therefore, the surface of the protective layer 5 is roughened.

The grain size of the particles "a" and "b" is larger than that of the particles "c" and "d". To this end, the electric power applied to the electrodes 24 and 26 of the targets 21 and 23 at the outside region A and B is controlled to be higher than the electric power applied to the electrodes 25 of the targets 22 at the central region C and D.

It is possible to appropriately control the electric power applied to the electrodes 24, 25 and 26 so that the grain size of the particles "a" and "b" is two or three times larger than that of the particles "c" and "d". For example, the electric power of 15 kW is applied to the electrodes 24 and 26 of the targets 21 and 23 at the outside region A and B and the electric power of 1 kW is applied to the electrodes 25 of the targets 22 at the central region C and D, with the result that the grain size of the particles "a" and "b" is approximately two times larger than that of the particles "c" and "d".

It is also possible to obtain the sputtered particles "a" and "b", and "c" and "d" having differently controlled grain sizes, by using a single target, and in this case, the electric power thereof if alternatingly changed.

It is also possible to obtain the sputtered particles "a" and "b", and "c" and "d" having differently controlled grain sizes, by using different materials at the regions A to D. For example, using titanium for the targets 21 and 23 at the outside region A and B and carbon for the targets 22 at the central region C and D. Titanium has a molecular radius of 1.47 angstrom while carbon has a molecular radius of 0.71 angstrom. Accordingly, it is possible to obtain the sputtered particles "a" and "b", and "c" and "d" having differently controlled grain sizes, without changing the electric power.

The surface of the protective layer 5 is thus toughened, and the roughness may be further enhanced if the targets 21 and 23 at the outside region A and B are arranged obliquely to the large disks 10, while the targets 22 at the central region C and D are arranged in parallel to the large disks 10. In this case, one kind of sputtered particles "a" and "b" having a larger grain size are obliquely deposited on the layer of the magnetic material 4, while another kind of sputtered particles "c" and "d" having a smaller grain size are perpendicularly deposited on the layer of the magnetic material 4. The larger particles "a" and "b" and the smaller particles "c" and "d" deposit one above another in this manner, and the roughness of the surface can be enhanced, as shown in FIG. 9.

We claim:

1. A method for manufacturing small magnetic disks having an outer diameter, said method comprising the steps of:

preparing a nonmagnetic large disk having an outer diameter and an inner diameter, one half of the difference between the outer and inner diameters of said large disk being greater than said outer diameter of said small disks to be manufactured;

subjecting said large disk to at least one step of a manufacturing process necessary for manufacturing a magnetic disk from a nonmagnetic substrate; and dividing said large disk into a plurality of said small disks.

2. A method according to claim 1, wherein each of said small disks comprises a nonmagnetic substrate, at least one underlayer applied to the substrate, a layer of magnetic material applied to said at least one underlayer, and a protective layer applied to the layer of magnetic material, and wherein said manufacturing process comprises the steps of applying said at least one underlayer to said substrate, applying said layer of magnetic material to said at least one underlayer, and applying said protective layer to the layer of magnetic material.

3. A method according to claim 2, wherein said large disk is divided into a plurality of said small disks after said manufacturing steps are completed.

4. A method according to claim 2, wherein said large disk is divided into a plurality of said small disks after at least one of said manufacturing steps is completed and the remaining manufacturing steps are completed after said large disk is divided.

5. A method according to claim 2, wherein each of said small disks further comprises a lubricating layer on the protective layer, and wherein said manufacturing process further comprises the step of applying said lubricating layer to the protective layer.

6. A method according to claim 5, wherein said lubricating layer is applied to the protective layer before said large disk is divided into a plurality of said small disks.

7. A method according to claim 5, wherein said manufacturing process further comprises the steps of subjecting said at least one underlayer to a texture treatment, polishing said at least one underlayer, and burnishing said protective layer.

8. A method according to claim 2, wherein said manufacturing process further comprises the step of subjecting said at least one underlayer to a texture treatment, said large disk being divided into a plurality of said small disks after said at least one underlayer is subjected to the texture treatment and the layer of magnetic material is applied to said at least one underlayer.

9. A method according to claim 2, wherein said manufacturing process further comprises the step of subjecting said at least one underlayer to a texture treatment, said large disk being divided into a plurality of said small disks before said at least one underlayer is subjected to the texture treatment and the layer of magnetic material is applied to said at least one underlayer.

10. A method according to claim 2, wherein said manufacturing process further comprises the step of subjecting said large disk to a levitation test and a characteristic test, said large disk being divided into a plurality of said small disks after said large disk is subjected to the tests.

11. A method according to claim 10, wherein each of said small disks further comprises a lubricating layer on the protective layer, and wherein said manufacturing process further comprises the step of applying said lubricating layer on the protective layer after said large disk is divided into a plurality of said small disks.

12. A method according to claim 1, wherein said outer diameter of said large disk corresponds to a standard size.

13. A method according to claim 2, wherein the step of applying said protective layer to the layer of magnetic material comprises a sputtering treatment.

14. A method according to claim 13, wherein the step of sputtering comprises simultaneously using at least two targets different from each other in applicable power.

15. A method according to claim 13, wherein the step of sputtering comprises simultaneously using at least two targets different from each other in material.

* * * * *

UNITED STATES PATENT AND TRADEMARK OFFICE
CERTIFICATE OF CORRECTION

PATENT NO. : 5,486,276
DATED : January 23, 1996
INVENTOR(S) : Kitamoto et al.

It is certified that error appears in the above-indentified patent and that said Letters Patent is hereby corrected as shown below:

Column 7, line 19, delete "5 10" and insert --5--.

Column 7, line 55, delete "toughened" and insert --roughened--.

Signed and Sealed this

Twenty-second Day of July, 1997

Attest:

BRUCE LEHMAN

Attesting Officer

Commissioner of Patents and Trademarks